United States Patent [19]
Hshieh et al.

[11] Patent Number: 6,048,759
[45] Date of Patent: Apr. 11, 2000

[54] GATE/DRAIN CAPACITANCE REDUCTION FOR DOUBLE GATE-OXIDE DMOS WITHOUT DEGRADING AVALANCHE BREAKDOWN

[75] Inventors: Fwu-Iuan Hshieh, Saratoga; Koon Chong So, San Jose; Yan Man Tsui, Union City; Danny Chi Nim, San Jose, all of Calif.

[73] Assignee: MagePower Semiconductor Corporation, San Jose, Calif.

[21] Appl. No.: 09/021,879

[22] Filed: Feb. 11, 1998

[51] Int. Cl.[7] ................................................. H01L 21/8238
[52] U.S. Cl. .......................... 438/206; 438/212; 438/232
[58] Field of Search ................................... 257/329, 333, 257/335; 438/136, 156, 173, 165, 179, 192, 206, 286, 209

[56] References Cited

U.S. PATENT DOCUMENTS

| | | | |
|---|---|---|---|
| 3,846,822 | 11/1974 | Riley et al. | 257/340 |
| 5,430,316 | 7/1995 | Contiero et al. | 257/335 |
| 5,444,002 | 8/1995 | Yang | 438/286 |
| 5,563,437 | 10/1996 | Davies et al. | 257/329 |
| 5,729,037 | 3/1998 | Hshieh et al. | 257/329 |
| 5,741,737 | 4/1998 | Kachelmeier | 438/286 |
| 5,814,859 | 9/1998 | Ghezzo et al. | 257/355 |
| 5,907,169 | 5/1999 | Hshieh et al. | 257/262 |

FOREIGN PATENT DOCUMENTS 234 269  9/1987  United Kingdom .................. 29/6

*Primary Examiner*—Wael Fahmy
*Assistant Examiner*—William David Coleman
*Attorney, Agent, or Firm*—Bo-In Lin

[57] ABSTRACT

This invention discloses a DMOS power device supported on a substrate of a first conductivity type functioning as a drain. The DMOS power device includes a polysilicon-over-double-gate-oxide gate disposed on the substrate includes a polysilicon layer disposed over a double-gate-oxide structure having a central thick-gate-oxide segment surrounded by a thin-gate-oxide layer with a thickness of about one-fourth to one-half of a thickness of the thick-gate-oxide segment. The DMOS power device further includes a body region of a second conductivity type disposed in the substrate underneath the thin-gate-oxide layer around edges of the central thick-gate-oxide segment the body region extending out laterally to a neighboring device circuit element. The DMOS power device further includes a source region of the first conductivity type disposed in the substrate encompassed in the body region having a portion extending laterally underneath the thin-gate-oxide layer. The DMOS power device further includes an insulation layer covering the polysilicon-over-double-gate-oxide gate with contact openings above the substrate exposing the source region and the body region.

19 Claims, 10 Drawing Sheets

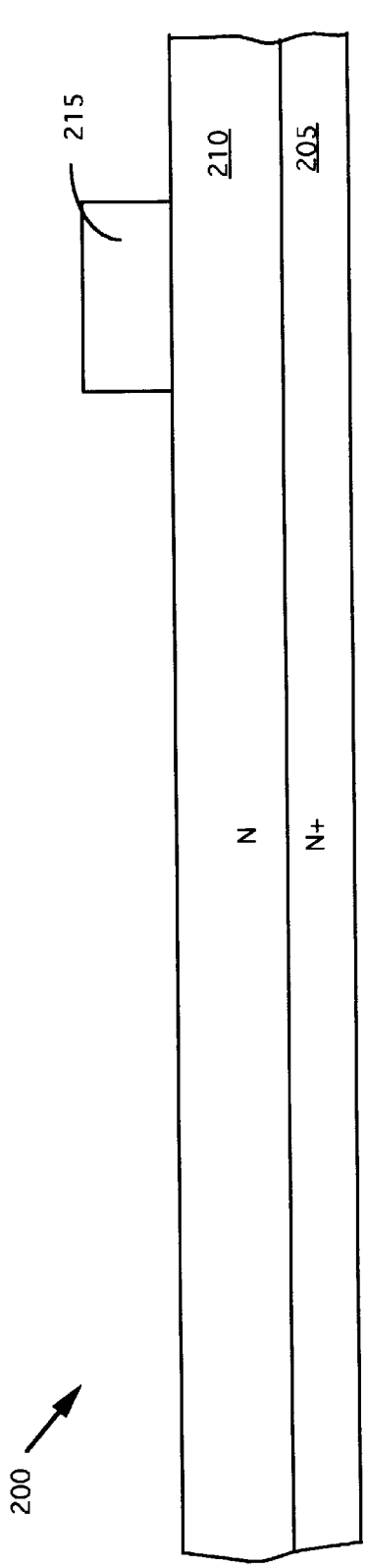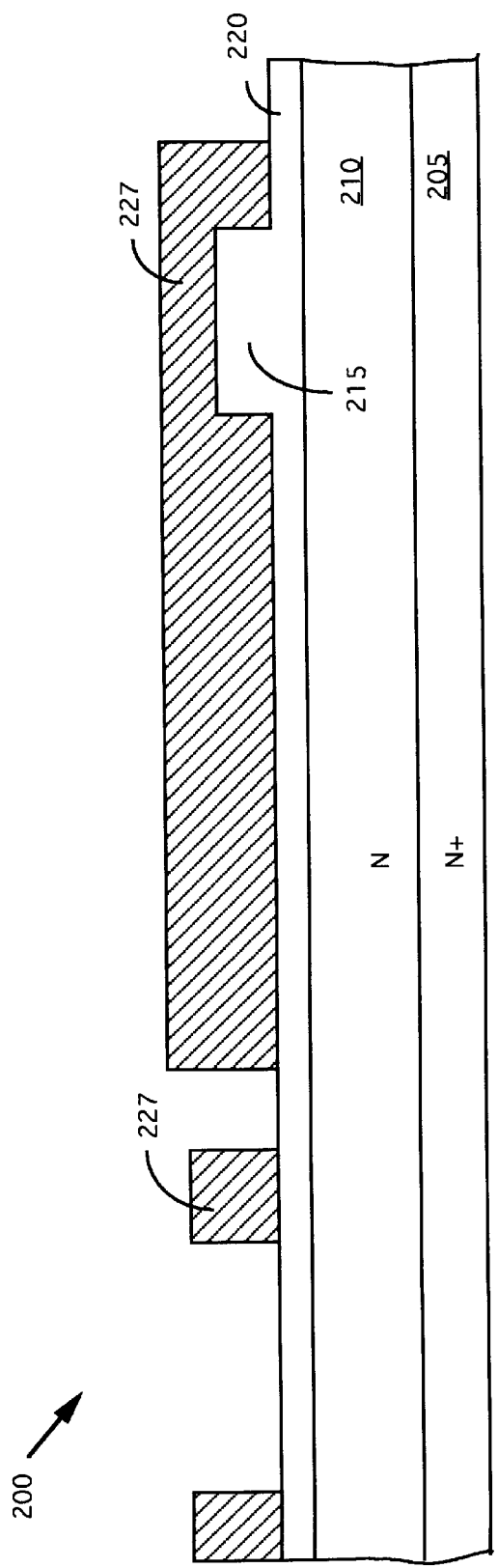

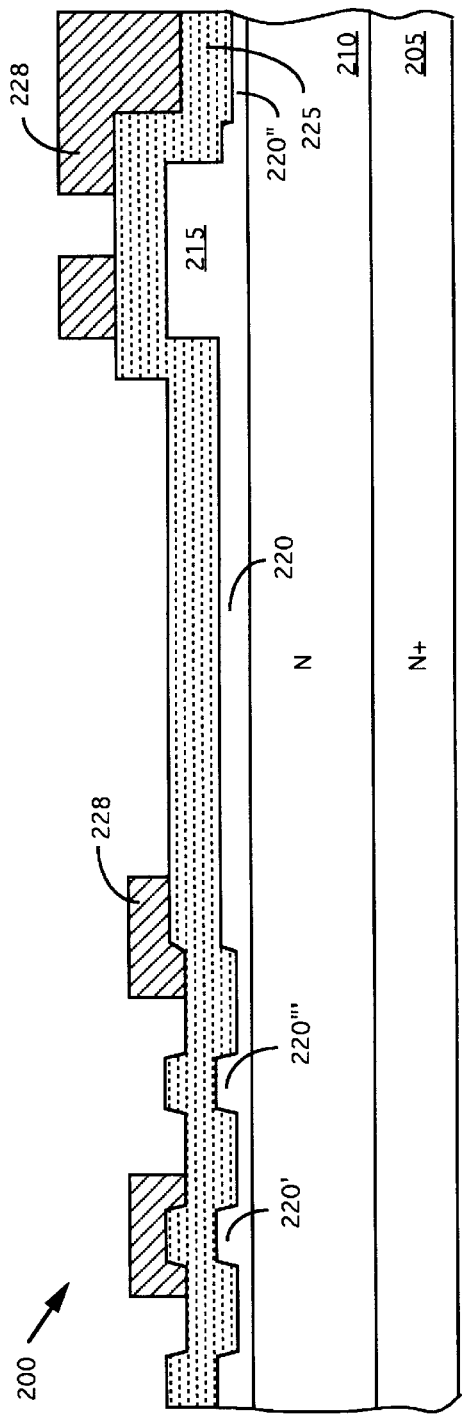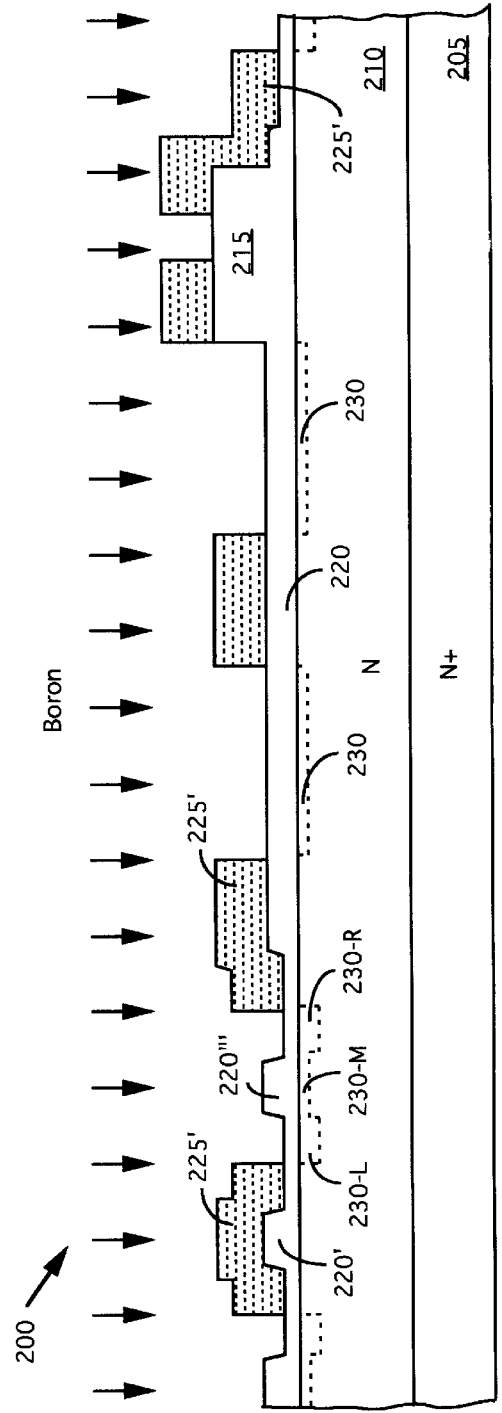

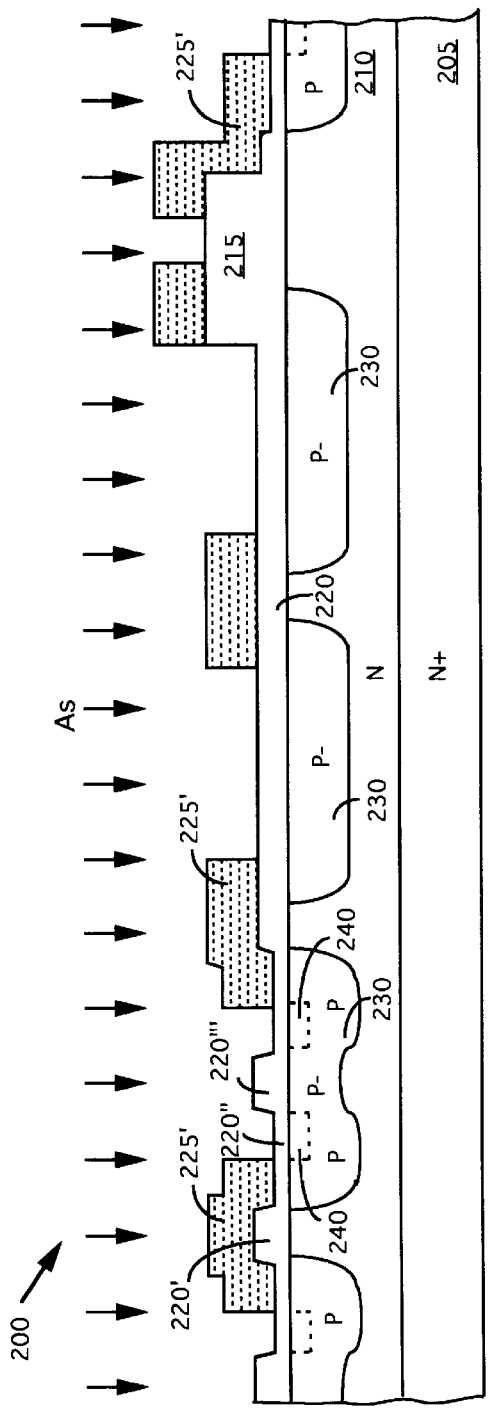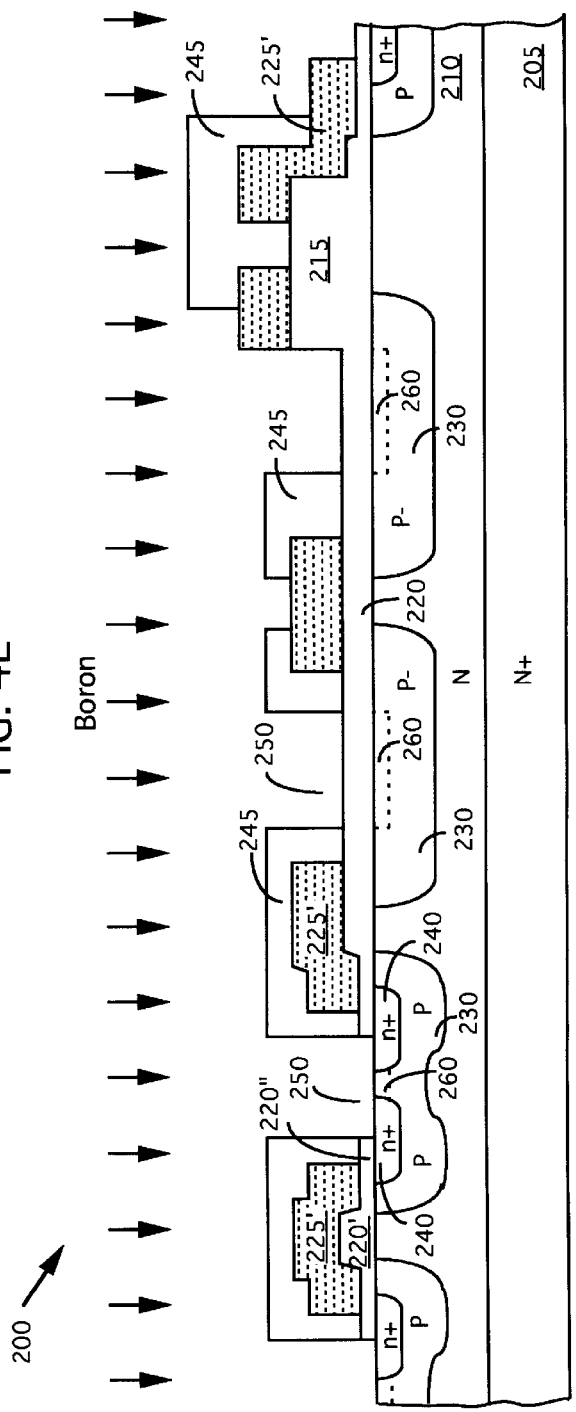
FIG. 4E
FIG. 4F

GATE/DRAIN CAPACITANCE REDUCTION FOR DOUBLE GATE-OXIDE DMOS WITHOUT DEGRADING AVALANCHE BREAKDOWN

BACKGROUND OF THE INVENTION

1. Field of the Invention

This invention relates generally to the structure and fabrication process of DMOS power devices. More particularly, this invention relates to a novel and improved DMOS device structure and fabrication process with double gate-oxide structure to reduce the gate/drain capacitance. The switching speed of the DMOS device is improved without degrading the breakdown voltage. Also, a low threshold voltage is maintained by controlling the ratio of layer thickness between the thick and thin gate oxide layers based on misalignment tolerance and body dopant profile.

2. Description of the Prior Art

The goal of increasing the switching speed by reducing the gate charges often causes other technical difficulties. Especially, when an oxide-terrace is used under the polysilicon gate for the purpose of reducing the gate/drain capacitance, degradation of the breakdown voltage is often induced. This is caused by the changes of the electrical field resulting from non-uniform insulation generated by placing a thick oxide layer underneath the polysilicon gates.

One specific example of such technical difficulties is disclosed in U.S. Pat. No. 5,273,922. It is entitled "High Speed Low Gate/Drain Capacitance DMOS Device", (issued on Dec. 28, 1993). As that shown in FIG. 3, Tsoi discloses a DMOS device with field oxide in the channel between adjacent transistors and an impurity implanted through the same opening in which the field oxide is formed. The gate is deposited over the field oxide and spaced from the supporting epitaxial layer by the field oxide to reduce the gate-to-drain capacitance. The implant impurity blow the field oxide reduces the on-resistance of the device. With these advantages intended by Tsoi's DMOS device, it is however limited by a difficulty that the breakdown voltage is degraded. Degradation of the breakdown voltage is illustrated in FIG. 2B. Actual breakdown voltage is measured for a DMOS power device provided with gate oxide layer with different thickness. The breakdown voltage BV is kept without significant change when the gate oxide layer is about one to four times the thickness of the normal gate oxide layer. The breakdown voltage starts to decrease rapidly when the gate oxide layer become greater than five times as that of the normal gate oxide layer.

In addition to the problem with breakdown voltage degradation, the DMOS device as disclosed by Tsoi has another technical difficulty. In forming the thick field oxide layer, a local oxidation process is employed. The oxidation of silicon proceeds slightly under the nitride. Due to the extremely thermal expansion-coeffident mismatch between the silicon nitride and the underlying silicon, damages are generated to the unoxidized silicon regions. In order to suppress this effect, a thin layer of silicon dioxide layer is grown prior to the placement of the silicon nitride mask This however aids to the penetration of the oxide under the nitride masked region and resulting in structures generally identified as "bird beaks" or "bird crests". (For more details of this phenomenon please refer to "VLSI Fabrication Principles" pp 576–581, by Ghandhi, published by Wiley-Interscience, New York). Additionally, during the growth of the field oxide, another phenomenon occurs that can cause defects later when the gate oxide is grown. Kooi et al. discovered that a thin layer of silicon nitride can form on the silicon surface, i.e., at the pad-oxide/silicon interface. This occurs due to the $NH_3$ or some other NH compound or nitrogen is generated from the reaction between $H_2O$ and the masking nitride during the field-oxide step. The $NH_3$ then diffuses through the oxide and reacts with the silicon substrate to form silicon nitride spots or ribbon, often referred to as white ribbon. When the gate oxide is subsequently grown, the growth rate becomes impeded at the locations where such silicon nitride remains. The gate oxide layer is thinner at those locations than elsewhere. One way to overcome this problem is to either etch the pad oxide long enough to ensure that the ribbon is removed or to grow a wet sacrificial gate oxide. This sacrificial gate oxide is removed by wet etching before growing the final gate oxide layer. Sacrificial oxidation and post oxidation-etch is commonly employed prior to gate-oxidation as described above. However, for power MOSFET with large active area, these processing steps are very difficult to carry out to satisfy a low leakage current requirement. The chemical removal of the sacrificial oxide will again consume part of the field oxide and may cause structural defects between the interface between the thick field oxide and thin gate-oxide layer. Due to these structural defect at the interface between the thick and thin gate-oxide layers, a high gate-to-drain leakage current is induced.

Furthermore, Tsoi's device has another problem that the size of the transistors can not be further reduced to increase the cell density. The lateral dimension of a transistor cell is limited by a misalignment tolerance between the polysilicon gate and the field oxide. In order to avoid an increase in the device threshold voltage, the body regions must be kept at a certain distance away from the field oxide areas. However, since the body implant is not self-aligned to the field oxide, sufficient space has to be allowed to accommodate potential misalignment errors within the alignment tolerances. The lateral dimensions of the transistor are prevented from being further reduced due to this requirement.

Therefore, there is still a need in the art of power device fabrication, particularly for DMOS design and fabrication, to provide a structure and fabrication process that would resolve these difficulties.

SUMMARY OF THE PRESENT INVENTION

It is therefore an object of the present invention to provide a new DMOS fabrication process and a new device structure. Those of ordinary skill in the art of DMOS fabrication will be enabled to reduce gate-to-drain capacitance to achieve higher device switching speed. Meanwhile, the technical difficulties of breakdown degradation and gate-to-drain leakage currents will be resolved. The DMOS device performance and reliability are both improved such that aforementioned limitations and difficulties as encountered in the prior art can be overcome.

Specifically, it is an object of the present invention to provide an improved DMOS structure and fabrication process with a double-gate-oxide structure under the gate. The double gate-oxide structure includes a thick-gate-oxide above the drain region surrounded by a thin-gate oxide above the body-source region. The thick-oxide has a thickness about two-to-four time's thickness of the thin-gate-oxide layer. An early breakdown is prevented while the gate/drain capacitance is reduced with improved switching speed.

Another object of the present invention is to provide a novel DMOS structure and fabrication process, which can tolerate the p-body regions to extend to a region under the thick-gate-oxide without increasing the threshold voltage. This is achieved by controlling the ratio of the layer thickness of the thick-gate oxide to the surrounding thin-gate oxide and the dopant concentration profile. Less stringent alignment requirements can be applied without unduly increasing the threshold voltage. Processes for manufacturing the DMOS device are simplified because greater tolerances of misalignment are allowed.

Briefly, in a preferred embodiment, the present invention includes a method for fabricating a DMOS device supported on a substrate. The method includes the steps of (a) growing a thick-gate-oxide layer on the substrate, having a thickness of about two to three times the thickness of a regular gate-oxide layer, followed by applying a thick-gate-oxide mask to define a plurality of thick-gate-oxide segments; (b) forming a thin-gate-oxide layer uncovered by the plurality of thick-gate-oxide segments then depositing a polysilicon layer; (c) applying a gate mask for defining a plurality of polysilicon-over-double-gate-oxide gates; (d) implanting a body dopant followed by a body diffusion for forming body regions; (e) applying a source blocking mask for implanting a source dopant to form a plurality of source regions; (f) forming an overlying insulation layer covering the DMOS device followed by applying an etch with a contact mask to open a plurality of contact openings there-through; (g) performing a low energy body dopant implant to form a shallow high concentration body dopant in the body regions then removing the contact mask; (h) performing a high temperature reflow process for the overlying insulation layer and for driving the source regions and the shallow high concentration body dopant regions into designed junction depths; (i) depositing a metal layer followed by applying a metal mask for patterning the metal layer to define a plurality of metal segments.

These and other objects and advantages of the present invention will no doubt become obvious to those of ordinary sidil in the art after having read the following detailed description of the preferred embodiment which is illustrated in the various drawing figures.

BRIEF DESCRIPTION OF THE DRAWINGS

FIGS. 4A to 4G show the processing steps for manufacturing an alternate planar DMOS device of the present invention.

DETAILED DESCRIPTION OF THE PREFERRED EMBODIMENT

Figure 1:
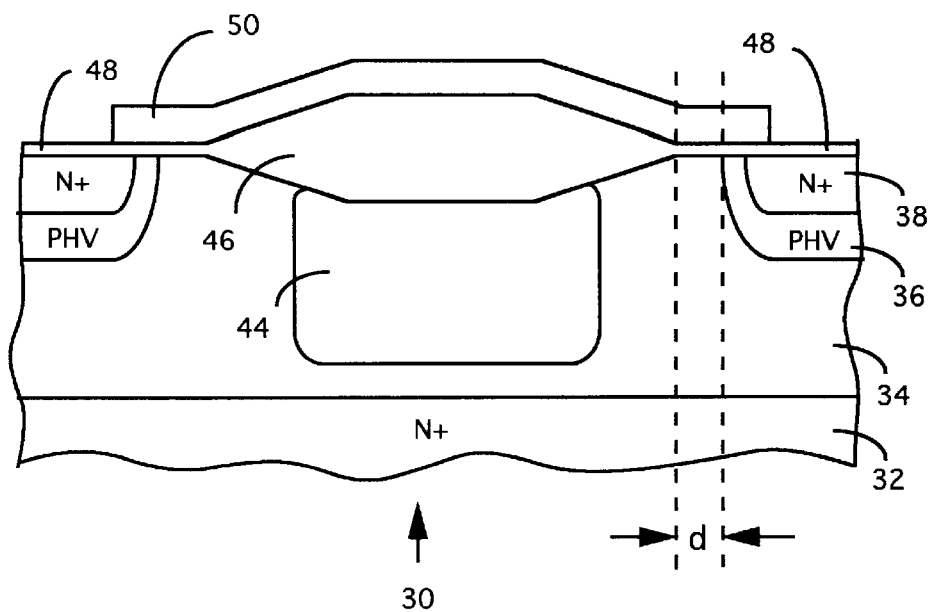
FIG. 1 is a cross sectional view of a prior art DMOS device having a field oxide formed by a LOCOS technique in the channels between adjacent transistors.
Figure 2A:
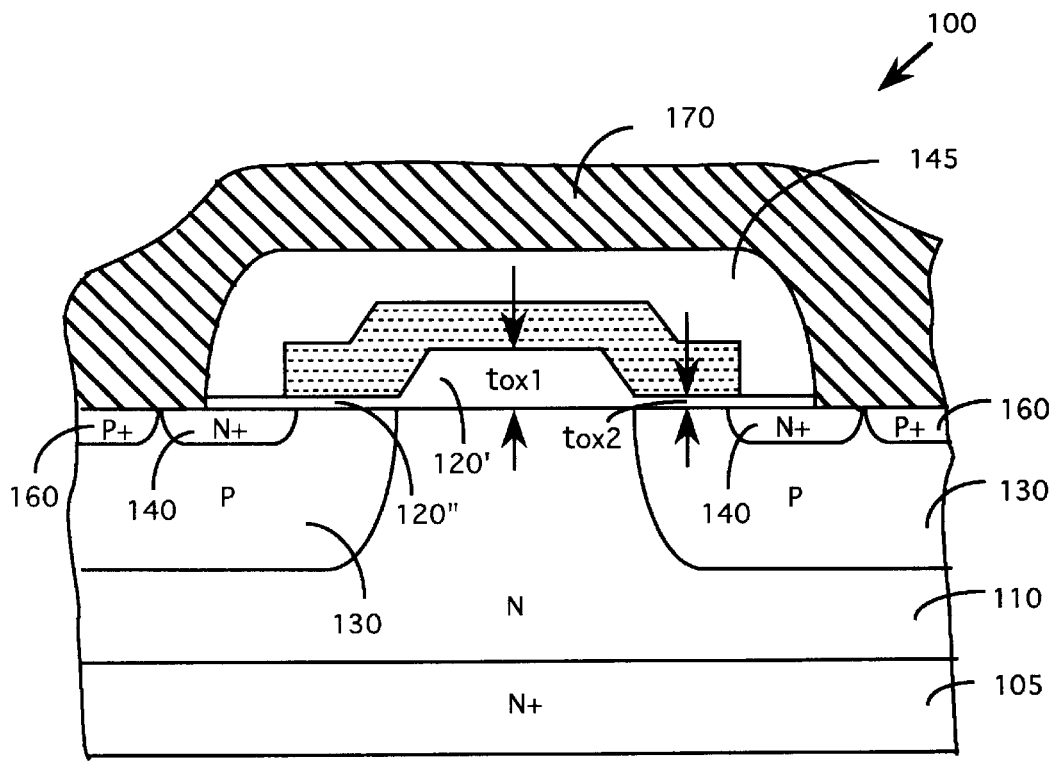
FIG. 2A is a cross sectional view of a DMOS power device of the present invention.

Referring to FIG. 2A for a cross sectional view of a DMOS power device 100 represented by a novel transistor cell of this invention. The DMOS power device 100 includes a plurality of transistor cells wherein each transistor cell is supported on a N+ substrate 105 functioning as a drain for the transistor cell. An N epitaxial layer 110 is formed over the substrate. Each transistor cell includes a polysilicon-over-double-gate-oxide gate segment disposed in a central portion of the transistor cell. The polysilicon-over-double-gate-oxide gates include a trapezoid-shaped thick-gate-oxide segment 120' above the drain region 110 covered under a polysilicon layer 125. The polysilicon layer 125 extends over the outer edges of the trapezoid-shaped thick-gate-oxide segments 120' and cover the areas surrounding the trapezoid-shaped thick-gate-oxide segments 120' insulated by an thin-gate-oxide layer 120" above the body regions 130 and the source regions 140. The thickness of the thick-gate-oxide 120' is about twice to four times the thickness of the thin-gate oxide layer 120'.

Each transistor cell further includes an N-type source region 140 surrounding the outer edges of the polysilicon gate 125 having a portion extends under the gate 125. A p-type body region 130 encompasses the source region 140. Vertically, the p-body region 130 extends deeper into the epitaxial layer 110 and laterally extends beyond a region covered by the thin-gate-oxide layer 120". The p-type body region 130 extends to a region right under the interface of the thin-gate-oxide layer 120" and the thick-gate-oxide segments 120'.

The DMOS power device 100 is further covered with a BPSG or PSG insulation layer 145 with a plurality of contact openings 150 open through the insulation layer 145 for depositing an overlaying metal layer 170. The metal layer 170 is then patterned into a plurality of metal segments. These metal segments include a source metal segments 170-S and gate-metal segments (G), field plate metal segment (FP), equal potential ring metal segment (EQR). The gate-metal segment (G), field plate metal segment (FP), and equal potential-ring metal segment (EQR) is not shown for simplicity and clarity for illustrating the main features of this invention.

Figure 2B:
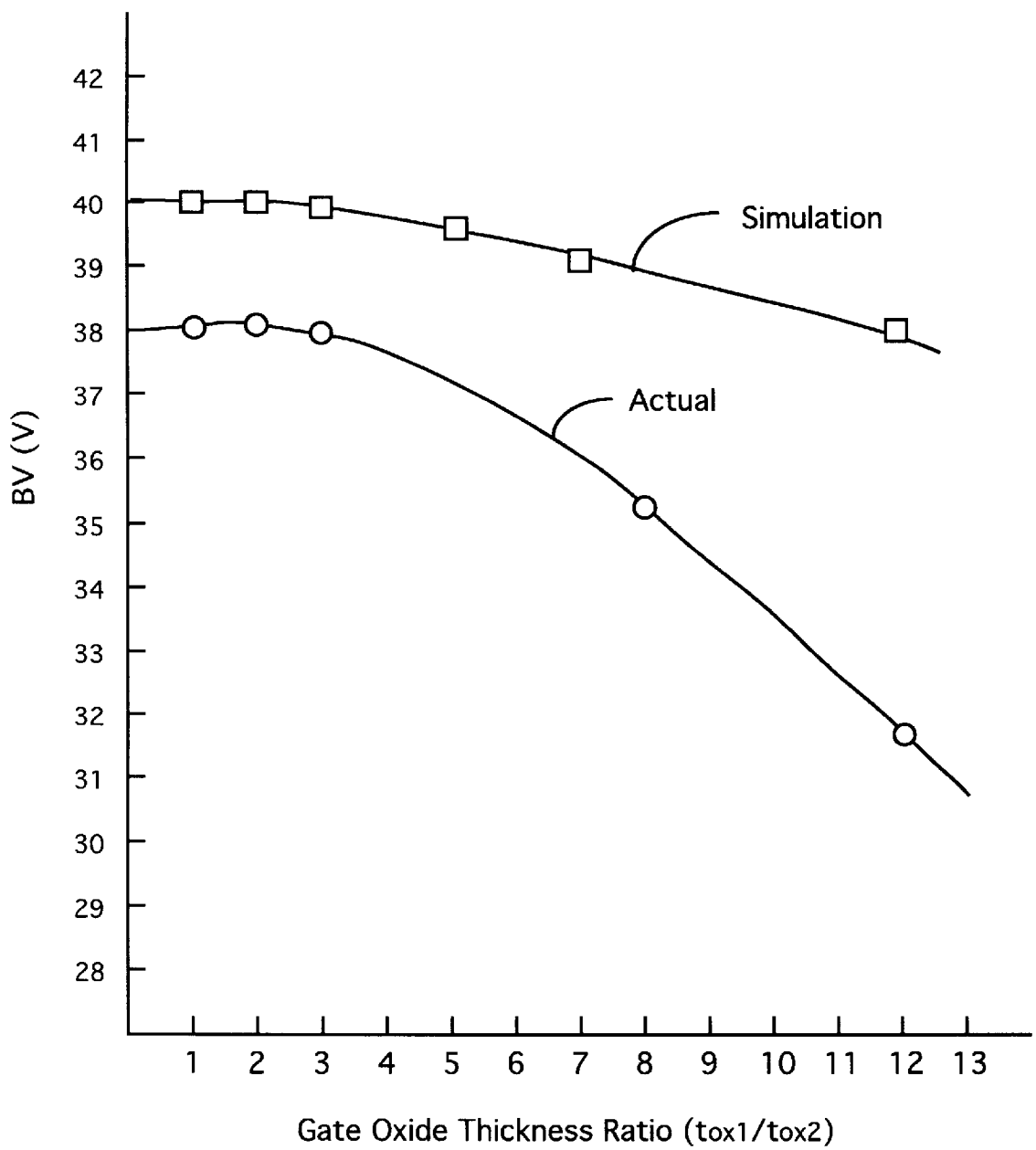
FIG. 2B is a diagram showing the variation of the breakdown voltage (BV) as a function of the ratio of the thickness of the thick-gate-oxide to that of the thin-gate-oxide layer.
Figure 2C:
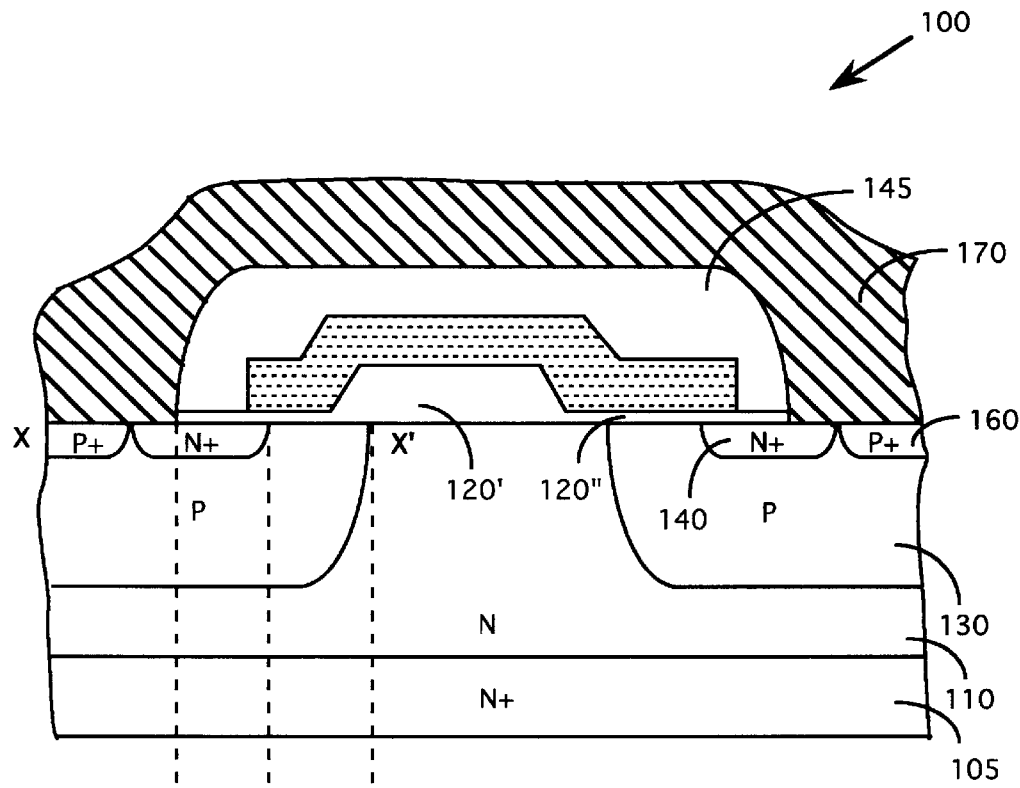
FIG. 2C shows a cross sectional view of a DMOS of the present invention with a misalignment between the thick-gate-oxide segments and the polysilicon mask.

Referring to FIGS. 2C and 2B for a DMOS transistor cell of this invention which is identical to that shown in FIG. 2A except that there is a misalignment. The misalignment is between the polysilicon mask and the thick-gate-oxide segments 120'. The polysilicon gate 125 is not symmetrically formed to the center of the thick-gate-oxide segment 120". The body region 120 is also deviates from its normal position and is shifted to the right relative to the thick-gate-oxide 120". The body regions thus laterally extend beyond the interface of the thin-gate-oxide layer 120" and the thick-gate-oxide segment 120". The distance of the portion that the pbody extends beyond the interface is represent by "MT", i.e., a lateral misalignment tolerance. FIG. 2C is a diagram showing the net dopant concentration variation along a line X–X', marked out in FIG. 2C, in a lateral direction at the surface of the silicon substrate of the DMOS device transistor cell. From point A to point B is the N+ type region. The net N-type dopant concentration decreases gradually from a peak to a minimum value at point B where the N+ source region 140 interfaces with the P-body region 130. The body dopant concentration raises gradually to a maximum value $N_{MAX}$ from point B. Then, it decreases gradually to a concentration $N_C$ at point C where a thinner gate oxide layer 120" interfaces with the thick-gate-oxide segments 120'. Because the pbody dopant concentration has a Gaussian distribution profile, the p-dopant concentration decreases at a higher rate from points C to D than that from points B to C. The threshold voltage Vth is proportional to the thickness $t_{OX2}$ of the thin-gate-oxide layer 120" and the square root of the maximum body dopant concentration $N_{MAX}$.

$$\text{Vth} [t_{OX2}(N_{MAX})^{0.5}] \tag{1}$$

Meanwhile the value of the maximum body dopant concentration $N_{MAX}$ is related to the dopant concentration $N_C$ at point C. In order to maintain a low threshold voltage Vth, the dopant concentration $N_C$ at point C must be kept at a certain value. Specifically:

$$N_C < (t_{OX2}/t_{OX1})^2 N_{MAX} \tag{2}$$

Figure 2D:
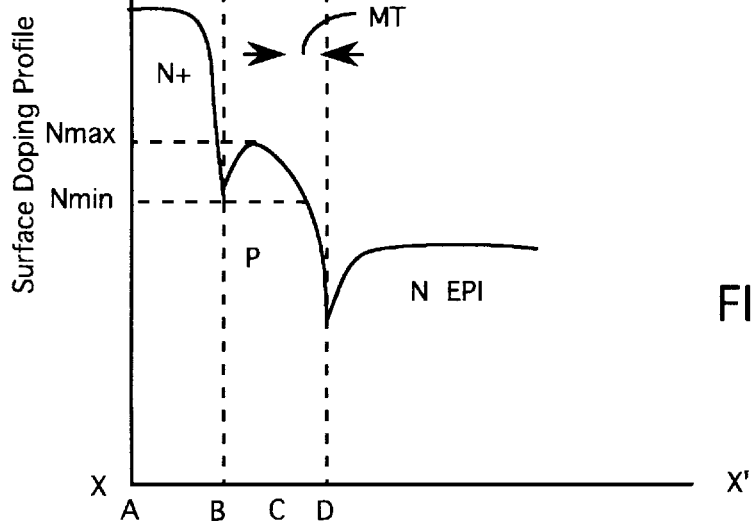
FIG. 2D shows the corresponding doping profile of FIG. 2C along a line X–X' as that marked out in FIG. 2C.
Figure 2E:
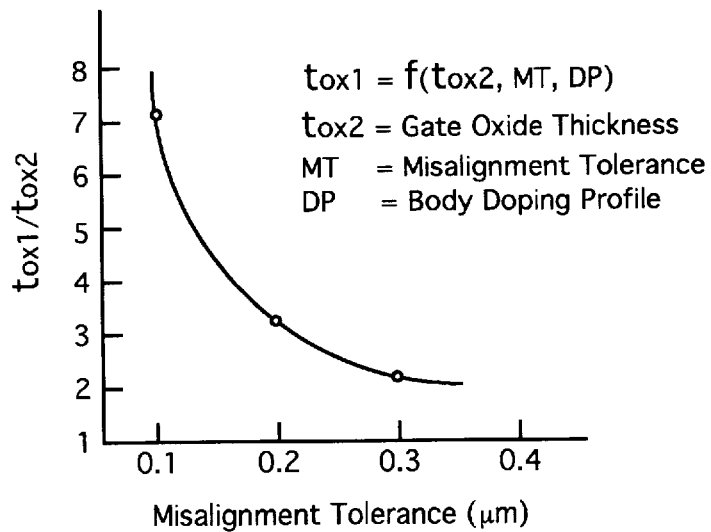
FIG. 2E shows the ratio of ($t_{OX2}/t_{OX1}$) refinement versus variation of misalignment tolerance to maintain a low threshold voltage.

For the purpose of keeping a relative low threshold voltage, the thickness $t_{OX1}$ of the thick-gate-oxide segments 120' is maintained at a certain ratio relative to the thickness $t_{OX2}$ of the thin-gate oxide layer 120". Specifically, for the purpose of keeping the misalignment tolerance of about 0.15 to 0.3 micrometers as that shown in FIG. 2E:

$$4t_{OX2} > t_{OX1} > t_{OX2} \tag{3}$$

By keeping such a ratio, the threshold voltage Vth is kept substantially at a constant level without being adversely affected by a misalignment ranging from 0.15 to 0.3 micrometers. For a preferred embodiment, of a DMOS power device having a cell density at six to eleven million cells/inch$^2$, the widths of the gate 125 and the thick-gate-oxide segments 120' are about three to five micrometers and one to two micrometers respectively. The thickness of the thin-gate-oxide layer 120" and the thick-gate-oxide segments 120' are about 150 to 1000 Angstroms and 450 to 4000 Angstroms respectively. The breakdown voltage is about 12 to 100 volts, and the threshold voltage is about one to three volts.

Figure 3A:
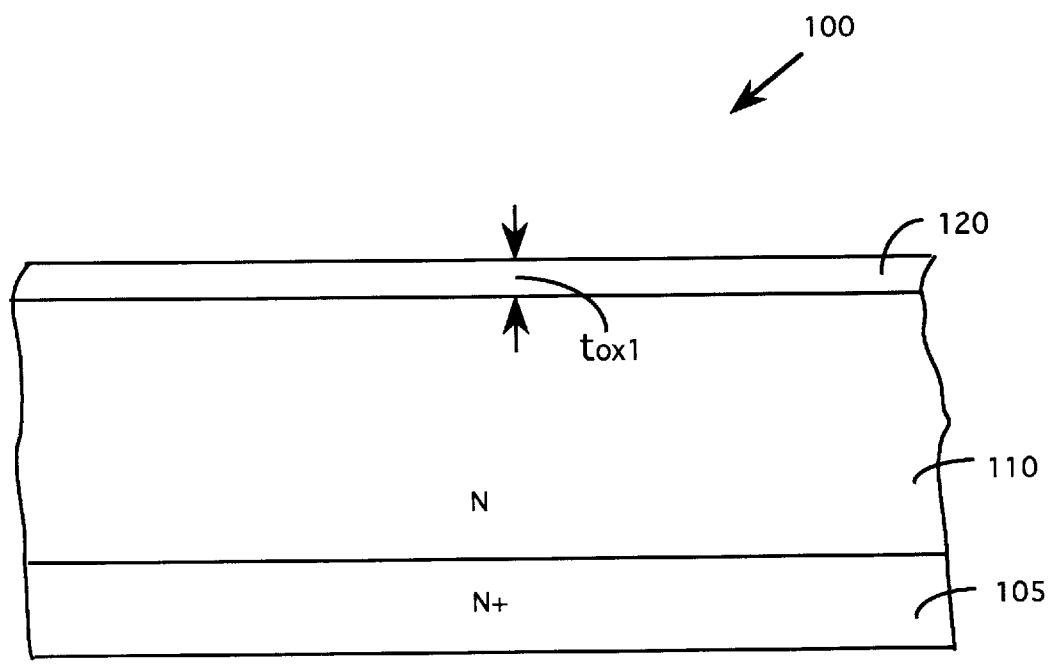
FIGS. 3A to 3E show the processing steps for manufacturing a planar DMOS device of the present invention.

Referring to FIGS. 3A to 3E for the processing steps applied to manufacture the DMOS power device 100. As shown in FIG. 3A, the processing steps begins by first growing a N− epitaxial layer 110 with a resistivity ranging from 0.1 to 10 ohm-cm on top of a N+ substrate 105. The substrate has a resistivity of 0.001 to 0.02 ohm-cm. The thickness and the resistivity of the epitaxial layer 110 depend on the requirements for the on-resistance and breakdown voltage. In a preferred embodiment, the thickness of the epi-layer 110 is about six to ten microns. A thick-gate-oxide layer 120 of thickness in the range of 450 to 4000 Angstroms is grown. This thick-gate-oxide layer is about two to four times the thickness of a regular gate-oxide layer. The thickness of this thick-gate-oxide layer 120 is specially designed for a particular purpose to be further discussed below.

Figure 3B:
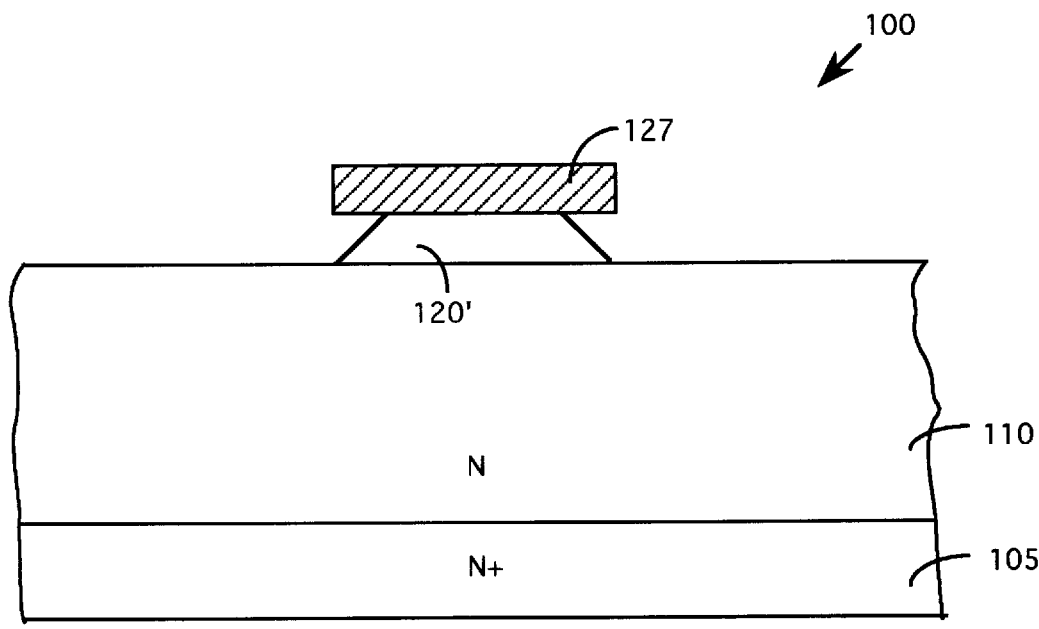

Referring to FIG. 3B, a thick-gate-oxide mask 127 is applied to perform a wet etch by the use of a wet etchant of HF or BOE. A plurality of trapezoid-shaped thick-gate-oxide segments 120' are formed. The outer edges of the trapezoid-shaped thick-gate-oxide segments 120' have a tilt angle θ. The tilt angle θ is formed because of an undercutting profile resulting from the wet etch. In removing the exposed portion of the thick-gate-oxide layer 120, a portion covered under the mask 127 is also removed because of the lateral etch.

Figure 3C:
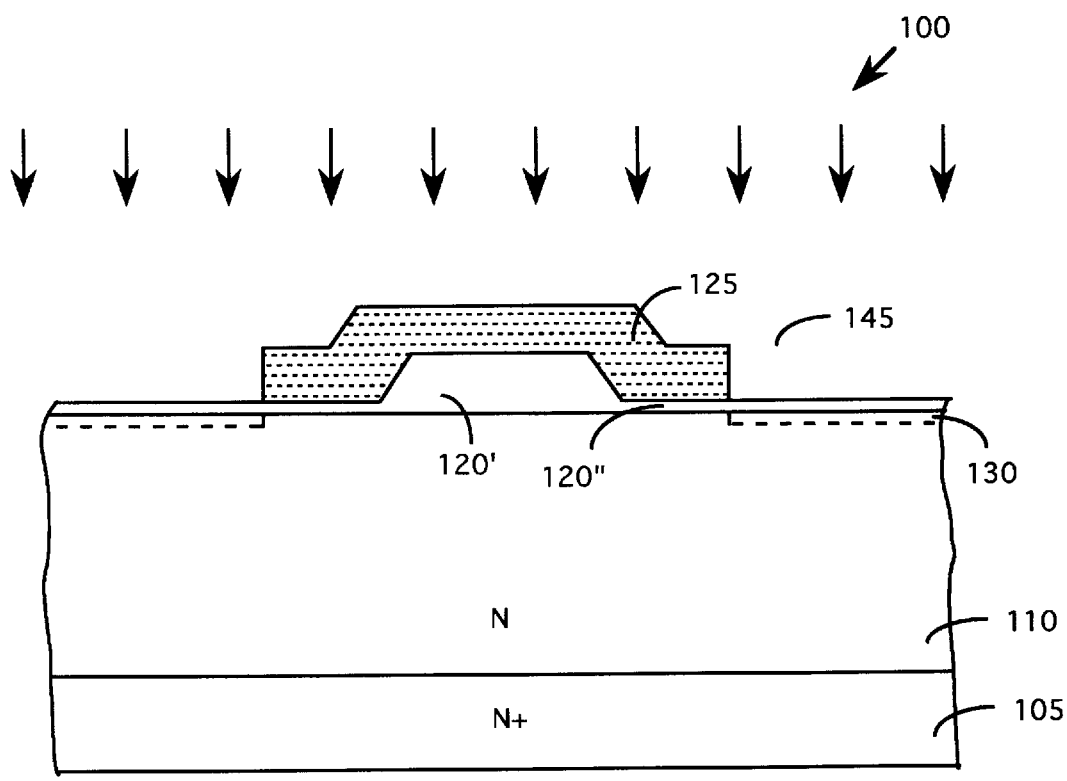

Referring to FIG. 3C, a thin-gate-oxide layer 120" with a thickness ranging from 100 to 1000 Angstrom is formed. A polysilicon layer 125 having a thickness of approximately 3000 to 10,000 Angstroms is then deposited. A POCL$_3$ doping process is carried out. A polysilicon mask (not shown) is applied for carrying out an anisotropic etching to pattern a plurality of polysilicon-on-double-gate-oxide gates 125'. As described in FIGS. 2C to 2E, the misalignment tolerance of the polysilicon mask with the thick-gate-oxide segments 120' is allowed to range between 0.15 to 0.3 micrometers. The threshold voltage is kept substantially unchanged with the misalignment when the thickness of the thick-gate-oxide segments 120' is formed with a thickness ranging between two to four times of the thickness of the gate-oxide layer 120". Each of the polysilicon segments 125' covers the thick-gate-oxide segments 120' and extends out laterally from the tilt edges covering the substrate area around the thick-gate-oxide segments 120'. The polysilicon mask is stripped. A p-body implant at 30–100 Kev with an ion beam of $3\times10^{13}$ to $3\times10^{14}$/cm$^2$ flux density is performed to form the p-body region 130.

Figure 3D:
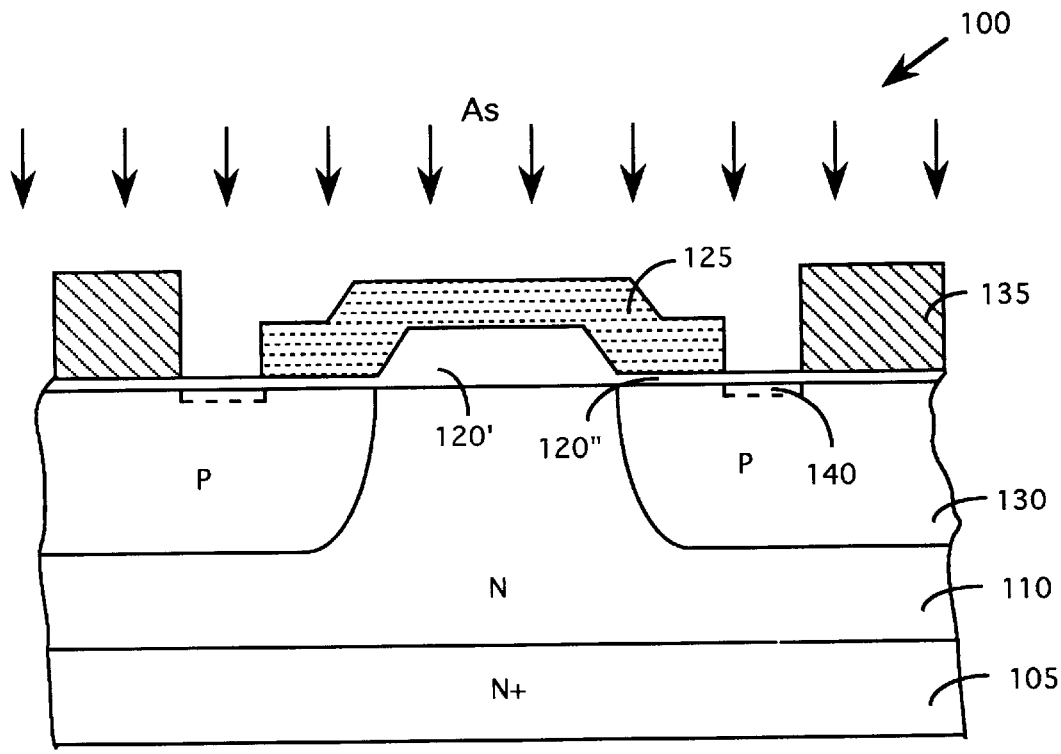

Referring to FIG. 3D, a p-body diffusion process is carried out at an elevated temperature of 1,000–1,200° C. for ten minutes to three hours to increase the depth of the p-body region 135 to 1.0–2.0 μm. A source-blocking mask 135 is applied to carry out a source implant. The source implant is carried out with a source ion beam of either a phosphorous ions at an energy of 60–100 Kev and ion flux density of $5\times10^{15}$ to $1\times10^{16}$/cm$^2$. Alternately, the source implant can be carried out with an arsenic ion beam at an energy of 60–150 Kev and ion flux density of $1\times10^{15}$ to $1\times10^{16}$/cm$^2$ to form the source regions 140.

Figure 3E:
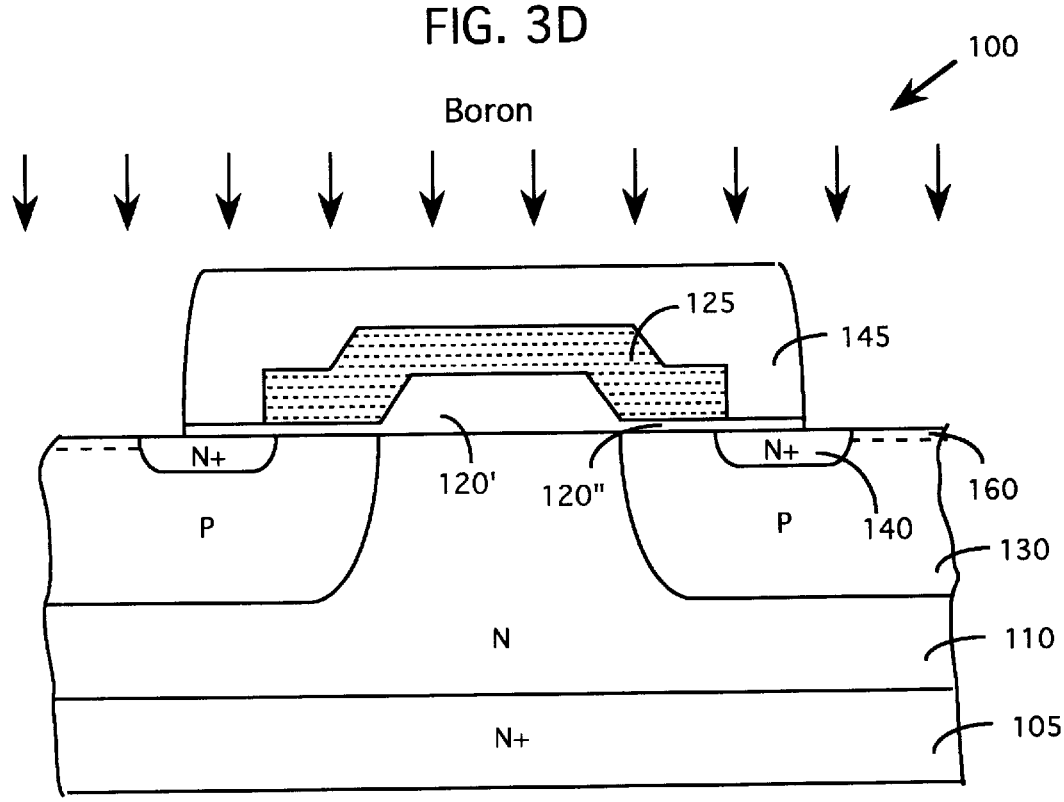

In FIG. 3E, a BPSG or PSG layer is deposited to form an insulation layer 145 of approximately 5000–15000 Å in thickness. A contact mask (not shown) is applied to first perform a dry etch to etch the insulation layer 145 to define a plurality of contact windows 150. A shallow body implant is performed to form a shallow high concentration body region 160 with either a low energy boron implant with an ion flux of $1\times10^{14}$ to $2\times10^{15}$/cm$^2$ at about 20 to 60 Kev. Alternately, a high-energy BF$_2$ implant is performed with an ion flux of $1\times10^{14}$/cm$^2$ to $2\times10^{15}$ at about 100–240 Kev.

According to FIGS. 3A to 3E and the above description, this invention discloses a method for fabricating a DMOS device supported on a substrate. The method includes the steps of: (a) forming a thick-gate-oxide layer 120 on the substrate followed by applying a thick-gate-oxide mask 127 to define a plurality of thick-gate-oxide segments 120'; (b) forming a thin-gate-oxide layer 120" adjacent to the thick-gate-oxide segments 120' thus defining a plurality of thick-oxide-thin-oxide interfaces, i.e., point C as shown in FIG. 2, wherein the thin-gate-oxide layer 120" having a thickness about one-fourth to one-half of a thickness of the thick-gate-oxide segments 120'; (c) depositing a polysilicon layer 125 and applying a gate mask for defining a plurality of polysilicon segments 125 covering the thick-gate-oxide segments thus forming a plurality of polysilicon-over-double-gate-oxide gates 125'; (d) implanting a body dopant followed by a body diffusion for forming body regions 130. In a preferred embodiment, the method further includes the step of (e) applying a source blocking mask 135 for implanting a source dopant to form a plurality of source regions 140; (f) forming an overlying insulation layer 145 covering the DMOS device followed by applying an etch with a contact mask to open a plurality of contact openings 150 therethrough; (g) performing a low energy body dopant implant to form a shallow high concentration body dopant in the body regions 160 then removing the contact mask; (h) performing a high temperature reflow process for the overlying insulation layer and for driving the source regions 140 and the shallow high concentration body dopant regions 160 into designed junction depths; and (i) depositing a metal layer 170 followed by applying a metal mask for patterning said metal layer to define a plurality of metal segments. In a preferred embodiment, the step (a) of forming a plurality of thick-gate-oxide segments 120' is a step of forming the thick-gate-oxide segments 120' with a thickness of about 450 to 4000 Angstroms and the step (b) of forming the thin-gate oxide layer 120" is a step of forming the thin-gate oxide layer with a thickness of about one-fourth to one-half of the thickness of the thick-gate-oxide segments ranging between 150 to 1000 Angstroms. In another preferred embodiment, the step (d) of forming the body regions 130 by a body-diffusion is a step of laterally diffusing each of the body regions to the thick-oxide-thin-oxide interfaces (point-C).

In another preferred embodiment, the step (d) of forming the body regions 130 by a body-diffusion is a step of laterally diffusing the body regions beyond the interfaces by 0.15 to 0.3 micrometers without affecting a threshold voltage. In another preferred embodiment, the step (e) of applying a source blocking mask 135 for implanting a source dopant to form a plurality of source regions 140 is a step implanting the source regions with a doping profile such that $Nc<(T_{ox2}/T_{ox1})^2 N_{MAX}$ where Nc is a source dopant concentration under the thick-oxide-thin-oxide interfaces (point-C), $T_{ox2}$ is a thickness of the gate-oxide layer 120", $T_{ox1}$ is a thickness of the thick-gate-oxide segments 120', and the $N_{MAX}$ is a maximum dopant concentration of the source regions 140.

In summary, this invention discloses a method for fabricating a power device supported on a substrate. The method includes the steps of: (a) forming a thick-gate-oxide layer 120 on the substrate followed by applying a thick-gate-oxide mask 127 to define a plurality of thick-gate-oxide segments 120'; (b) forming a thin-gate-oxide layer 120" adjacent to the thick-gate-oxide segments having a thickness about one-fourth to one-half of a thickness of the thick-gate-oxide segments thus defining a plurality of thick-oxide-thin-oxide interfaces (point-C); (c) depositing a polysilicon layer 125 and applying a gate mask for defining a plurality of polysilicon segments covering the thick-gate-oxide segments 120' thus forming a plurality of polysilicon-over-double-gate-oxide gates 125; and (d) implanting a body dopant followed by a body diffusion for forming body regions 130 with each of the body regions 130 diffused laterally to the thick-oxide-thin-oxide interfaces (point-C).

In a preferred embodiment, the method further includes a step of applying a source blocking mask 135 for implanting a source dopant to form a plurality of source regions 140 and the source regions having a doping profile with $Nc<(T_{ox2}/T_{ox1})^2 N_{MAX}$ where Nc is a source dopant concentration under the thick-oxide-thin-oxide interfaces (point-C), $T_{ox2}$ is a thickness of the gate-oxide layer 120", $T_{ox1}$ is a thickness of the thick-gate-oxide segments 120', and the $N_{MAX}$ is a maximum dopant concentration of the source regions.

Figure 4G:
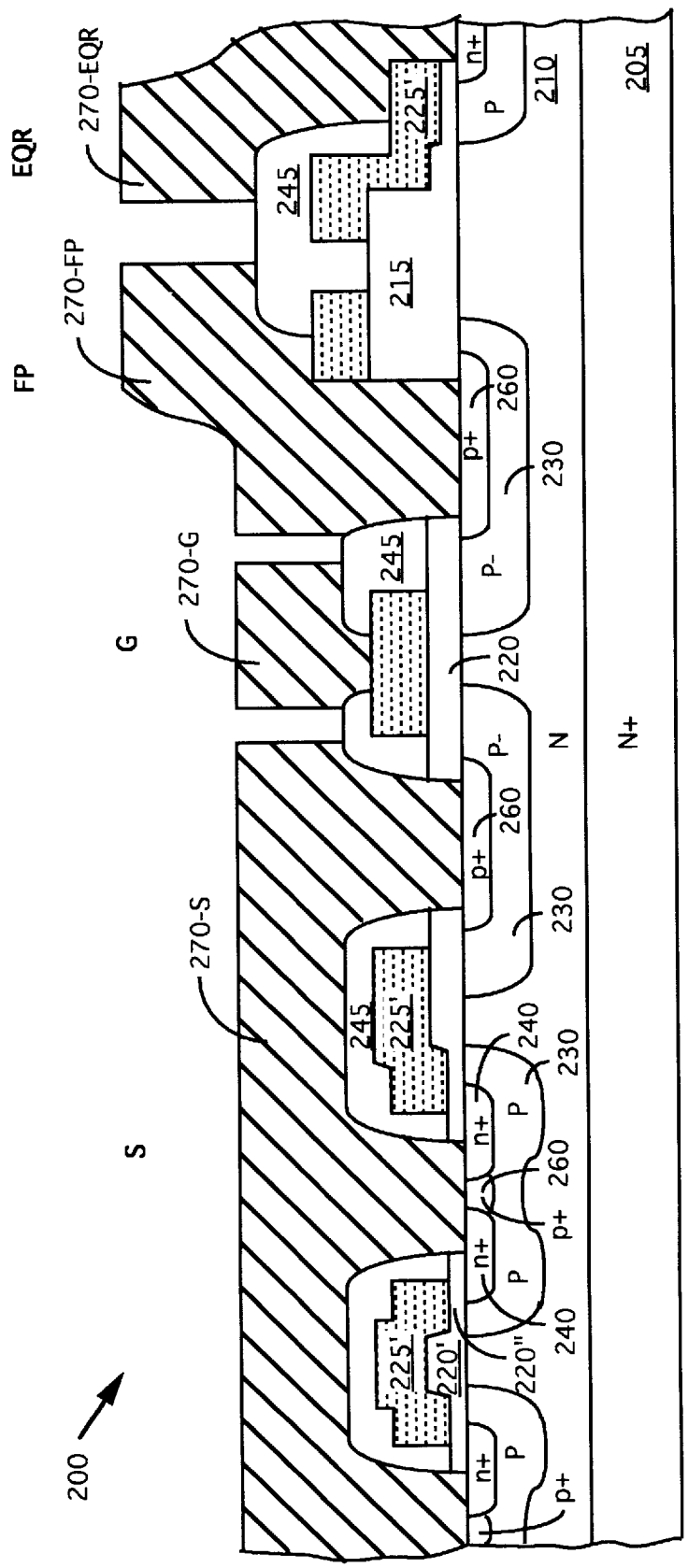

Referring to FIGS. 4A to 4G for the processing steps applied to manufacture an alternate DMOS power device 200 of this invention. In FIG. 4A, the processing steps begin by first growing a N− epitaxial layer 210 on top of a N+ substrate 205. In a preferred embodiment, the thickness of the epi-layer 210 is about six to ten microns. An initial oxide layer 215 is first on top of the epitaxial layer 210 and then removed to define the active areas. In FIG. 4B, a thick-gate-oxide layer 220 of thickness in the range of 450 to 4000 Angstroms is grown. This thick-gate-oxide layer 220 is about two to four times the thickness of a regular gate-oxide layer. The thickness of this thick-gate-oxide layer is specially designed for a particular multiple purposes to be further discussed below. A thick-gate-oxide mask 227 is applied to perform an oxide etch to remove a top portion of the thick-gate-oxide layer 220.

Referring to FIG. 4C, the thick-gate-oxide layer 220 covered under the thick-gate-oxide mask is patterned as a plurality of trapezoid-shaped thick-gate-oxide segments 220' with the uncovered portion etched as a thin-gate-oxide layer 220". The thin gate-oxide layer 220", with a top portion removed from the thick-gate-oxide layer 220, having a thickness ranging from 150 to 1000 Angstroms. A polysilicon layer 225 having a thickness of approximately 3000 to 10,000 Angstroms is then deposited. A $POCL_3$ doping process is carried out. A polysilicon mask 228 is applied. In FIG. 4D, an anisotropic etching is performed to pattern a plurality of polysilicon-on-double-gate-oxide gates 225' and to expose a plurality of source implant blocking-segments 220'''. A misalignment tolerance of the polysilicon mask 228 with respect to the thick-gate-oxide segments 220' in the range of 0.15 to 0.3 micrometers is acceptable. This is achieved by controlling the ratio of thickness of the thick-gate-oxide segments 220' to the gate-oxide 220" and by controlling the net-dopant profile as explained above for FIGS. 2C to 2E. Each of the polysilicon segments 225' covers the thick-gate-oxide segments 220' and extends out laterally from the tilt edges covering the substrate area around the thick-gate-oxide segments 220'. The polysilicon mask is stripped. A p-body implant at 30–100 Kev with an ion beam of $3\times10^{13}$ to $3\times10^{14}/cm^2$ flux density is performed to form the left and the right p-body regions 230-L and 230-R respectively. The middle portion 230-M of the implanted body region is shallower because the body dopant ions are blocked by the source-implant blocking segments 220'''.

Referring to FIG. 4E, a p-body diffusion process is carried out at an elevated temperature of 1,000–1,200° C. for ten minutes to three hours to increase the depth of the p-body region 230 to 1.0–2.0 μm which has a wide-W shaped profile. With the source-implant blocking segments 220''', a source-blocking mask is not required for carrying out a source implant. The source implant is carried out with a source ion beam of either a phosphorous ions at an energy of 60–100 Kev and ion flux density of $5\times10^{15}$ to $1\times10^{16}/cm^2$. Alternately, the source implant can be carried out with an arsenic ion beam at an energy of 60–150 Kev and ion flux density of $1\times10^{15}$ to $1\times10^{16}/cm^2$ to form the source regions 140.

In FIG. 4F, a BPSG or PSG layer is deposited to form an insulation layer 245 of approximately 5000–15000 Å in thickness. A contact mask (not shown) is applied to first perform a dry etch to etch the insulation layer 245 to define a plurality of contact windows 250. A shallow body implant is performed to form a shallow high concentration body region 260 with either a low energy boron implant with an ion flux of $1\times10^{14}$ to $2\times10^{15}/cm^2$ at about 20 to 60 Kev. Alternately, a high-energy $BF_2$ implant is performed with an ion flux of $1\times10^{14}/cm^2$ to $2\times10^{15}$ at about 100–240 Kev. In FIG. 4G, a metal layer 270 is deposited on top and a metal mask is applied to pattern a plurality of metal segments including the source metal (270-S), a gate metal (270-G), a field plate metal (270-FP) and an equal potential ring metal (270-EQR).

According to FIGS. 4A to 4G and the above descriptions, this invention discloses a method for fabricating a DMOS device supported on a substrate. The method includes the steps of: (a) forming a thick-gate-oxide layer 220 on the substrate followed by applying a thick-gate-oxide mask 227 to remove a top portion of the thick-gate-oxide layer 220 to define a plurality of thick oxide segments includes a plurality of thick-gate-oxide segments 220' and a plurality of source-implant-blocking oxide-segments 220" and a thin-gate-oxide-layer 220''' with the top portion removed, wherein the thin-gate-oxide layer 220''' having a thickness about one-fourth to one-half of a thickness of the thick-gate-oxide segments 220'; (b) depositing a polysilicon layer 225 and applying a gate mask for defining a plurality of polysilicon segments covering the thick-gate-oxide segments 220' and the thin-gate-oxide layer 220" thus forming a plurality of polysilicon-over-double-gate-oxide gates 225; (d) implanting a body dopant followed by a body diffusion for forming a plurality of merged wide-W-shaped body regions 230 with each of the body regions diffused laterally to the thick-oxide-thin-oxide interfaces. In a preferred embodiment, the method further includes steps of (e) employing the source-implant-blocking oxide-segments 220" for implanting a source dopant to form a plurality of source regions 240; and (f) forming an overlying insulation layer 245 covering the DMOS device followed by applying an etch with a contact mask to open a plurality of contact openings 250 there-through; (g) performing a low energy body dopant implant to form a shallow high concentration body dopant regions 260 in the body regions then removing the contact mask; (h) performing a high temperature reflow process for the overlying insulation layer and for driving the source regions 240 and the shallow high concentration body dopant regions 260 into designed junction depths; and (i) depositing a metal layer 270 followed by applying a metal mask for patterning the metal layer to define a plurality of metal segments.

Therefore, the present invention provides a new DMOS fabrication process and a new device structure to enable those of ordinary skill in the art of MOSFET fabrication to reduce gate-to-drain capacitance to achieve higher device switching speed. Meanwhile, the technical difficulties of breakdown degradation and gate-to-drain leakage currents are resolved. The DMOS device performance and reliability are both improved such that limitations and difficulties as encountered in the prior art are overcome. Specifically, an improved DMOS structure and a fabrication process are disclosed. The DMOS structure includes a thick-gate-oxide segment under the gate having a thickness about two-to-four time's thickness of the thin-oxide layer. An early breakdown is prevented while the gate charges are reduced with improved switching speed. The difficulties of leakage current caused by a bird-beak structural defect in the prior art are therefore resolved. Also, the thick-gate-oxide segment under each gate is made with a thickness such that the threshold voltage is not increased when there is a misalignment polysilicon mask and the thick-gate-oxide segments with a misalignment tolerance. The production cost is reduced with a simplified manufacture process, which has a less stringent alignment requirement.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A method for fabricating a DMOS device supported on a substrate comprising steps of:
   (a) forming a thick-gate-oxide layer on said substrate followed by applying a thick-gate-oxide mask to define a plurality of thick-gate-oxide segments;
   (b) forming a thin-gate-oxide layer adjacent to said thick-gate-oxide segments thus defining a plurality of thick-oxide-thin-oxide interfaces, wherein said thin-gate-oxide layer having a thickness greater than one-fourth of a thickness of said thick-gate-oxide segments;
   (c) depositing a polysilicon layer and applying a gate mask for patterning a plurality of polysilicon segments covering over an entire length of said thick-gate-oxide segments and extended over said thick-oxide-thin-oxide interfaces thus forming a plurality of polysilicon-over-double-gate-oxide gates; and
   (d) implanting a body dopant into said substrate between said plurality of polysilicon-over-double-gate-oxide gates followed by a body diffusion for forming body regions with each of said body regions extending laterally under said polysilicon-over-double-gate-oxide gates wherein said body regions having a portion extending lateral beyond said thick-oxide-thin-oxide interfaces with a lateral distance less than 0.3 micrometers.

2. The method of fabricating said DMOS device of claim 1 further comprising steps of:
   (e) applying a source blocking mask for implanting a source dopant to form a plurality of source regions in said substrate encompassed in said body region; and
   (f) forming an overlying insulation layer covering said DMOS device followed by applying an etch with a contact mask to open a plurality of contact openings there-through.

3. The method of fabricating said DMOS device of claim 2 further comprising a step of:
   (g) performing a low energy body dopant implant through said contact openings to form a shallow high concentration body dopant regions in said body regions right below said contact openings then removing said contact mask.

4. The method of fabricating said DMOS device of claim 3 further comprising a step of:
   (h) performing a high temperature reflow process for said overlying insulation layer and for driving said source regions and said shallow high concentration body dopant regions into designed junction depths in said substrate; and
   (i) depositing a metal layer followed by applying a metal mask for patterning said metal layer to define a plurality of metal segments.

5. The method of fabricating said DMOS device of claim 1 wherein:
   said step (a) of forming an thick-gate-oxide layer is a step of forming said thick-gate-oxide layer with a thickness of about 450 to 4000 Angstroms and said step (b) of forming said thin-gate-oxide layer is a step of forming said thin-gate-oxide layer with a thickness of about one-fourth to one-half of the thickness of said thick-gate-oxide layer ranging between 150 to 1000 Angstroms.

6. The method of fabricating said DMOS device of claim 1 wherein:
   said step (c) of depositing a polysilicon layer and applying a gate mask for patterning a plurality of polysilicon segments covering over an entire length of said thick-gate-oxide segments and extended over said thick-oxide-thin-oxide interfaces to form a plurality of polysilicon-over-double-gate-oxide gates is a step of allowing a misalignment tolerance 0.15 to 0.30 micrometers between said gate mask and said thick-gate-oxide segments.

7. The method of fabricating said DMOS device of claim 2 wherein:
   said step (e) of applying a source blocking mask for implanting a source dopant to form a plurality of source regions is a step implanting said source regions with a doping profile such that $Nc<(T_{ox2}/T_{ox1})^2 N_{MAX}$ where Nc is a source dopant concentration in said substrate immediately under said thick-oxide-thin-oxide interfaces, $T_{ox2}$ is a thickness of said thin-gate-oxide layer, $T_{ox1}$ is a thickness of said thick-gate-oxide segments, and said $N_{MAX}$ is a maximum dopant concentration of said source regions.

8. A method for fabricating a DMOS device supported on a substrate comprising steps of:

(a) forming a thick-gate-oxide layer on said substrate layer with a thickness of about 450 to 4000 Angstroms followed by applying a thick-gate-oxide mask to define a plurality of thick-gate-oxide segments;

(b) forming a thin-gate-oxide layer adjacent to said thick-gate-oxide segments thus defining a plurality of thick-oxide-thin-oxide interfaces, wherein said thin-gate-oxide layer having a thickness about one-fourth to one-half of a thickness of said thick-gate-oxide segments ranging between 150 to 1000 Angstroms;

(c) depositing a polysilicon layer and applying a gate mask for patterning a plurality of polysilicon segments covering over an entire length of said thick-gate-oxide segments and extended beyond said thick-oxide-thin-oxide interfaces covering a portion of said thin-gate-oxide layer thus forming a plurality of polysilicon-over-double-gate-oxide gates;

(d) implanting a body dopant between said polysilicon-over-double-gate-oxide gates followed by a body diffusion for forming body regions with each of said body regions diffused laterally to said thick-oxide-thin-oxide interfaces; and (e) applying a source blocking mask for implanting a source dopant to form a plurality of source regions and said source regions having a doping profile with $Nc< (T_{ox2}/T_{ox1})^2 N_{MAX}$ where Nc is a source dopant concentration in said substrate immediately under said thick-oxide-thin-oxide interfaces, $T_{ox2}$ is a thickness of said thin-gate-oxide layer, $T_{ox1}$ is a thickness of said thick-gate-oxide, and said $N_{MAX}$ is a maximum dopant concentration of said source regions.

9. A method for fabricating a power device supported on a substrate comprising steps of:

(a) forming a thick-gate-oxide layer on said substrate followed by applying a thick-gate-oxide mask to define a plurality of thick-gate-oxide segments;

(b) forming a thin-gate-oxide layer adjacent to said thick-gate-oxide segments having a thickness about one-fourth to one-half of a thickness of said thick-gate-oxide layer thus forming a plurality of thick-oxide-thin-oxide interfaces;

(c) depositing a polysilicon layer and applying a gate mask for patterning a plurality of polysilicon segments covering over an entire length of said thick-gate-oxide segments and extended beyond said thick-oxide-thin-oxide interfaces covering a portion of said thin-gate-oxide layer thus forming a plurality of polysilicon-over-double-gate-oxide gates; and (d) implanting a body dopant between said plurality of polysilicon-over-double-gate-oxide gates followed by a body diffusion for forming body regions with each of said body regions diffused laterally to said thick-oxide-thin-oxide interfaces and said thick-gate-oxide segments are above said substrate functioning as a drain region for said power device.

10. The method of fabricating said power device of claim 9 further comprising:

(e) applying a source blocking mask for implanting a source dopant to form a plurality of source regions and said source regions having a doping profile with $Nc< (T_{ox2}/T_{ox1})^2 N_{MAX}$ where Nc is a source dopant concentration in said substrate immediately under said thick-oxide-thin-oxide interfaces, $T_{ox2}$ is a thickness of said gate-oxide layer, $T_{ox1}$ is a thickness of said thick-gate-oxide segments, and said $N_{MAX}$ is a maximum dopant concentration of said source regions.

11. A method for fabricating a DMOS device supported on a substrate comprising steps of:

(a) forming a thick-gate-oxide layer on said substrate followed by applying a thick-gate-oxide mask to define a plurality of thick-gate-oxide segments and a plurality of source-implant-blocking oxide-segments between every two of said thick-gate-oxide segments;

(b) forming a thin-gate-oxide layer adjacent to said thick-gate-oxide segments thus defining a plurality of thick-oxide-thin-oxide interfaces, wherein said thin-gate-oxide layer having a thickness about one-fourth to one-half of a thickness of said thick-gate-oxide segments; and (c) depositing a polysilicon layer and applying a gate mask for patterning a plurality of polysilicon segments covering over an entire length of said thick-gate-oxide segments and extended beyond said thick-oxide-thin-oxide interfaces covering a portion of said thin-gate-oxide layer thus forming a plurality of polysilicon-over-double-gate-oxide gates.

12. The method of fabricating said DMOS device of claim 11 further comprising a step of:

(d) implanting a body dopant between said plurality of thick-gate-oxide segments and said plurality of source-implant-blocking oxide-segments followed by a body diffusion for forming a plurality of merged wide-W-shaped body regions with each of said body regions diffused laterally in said substrate to a region under said thick-oxide-thin-oxide interfaces and said thick-gate-oxide segments wherein said substrate functioning as a drain region for said power device;

(e) implanting a source dopant between said plurality of thick-gate-oxide segments and said plurality of source-implant-blocking oxide-segments to form a plurality of source regions; and (f) removing said source-implant blocking oxide segments and forming an overlying insulation layer covering said DMOS device followed by applying an etch with a contact mask to open a plurality of contact openings there-through.

13. The method of fabricating said DMOS device of claim 11 further comprising a step of:

(g) performing a low energy body dopant implant through said contact openings to form a shallow high concentration body dopant in said body regions then removing said contact mask;

(h) performing a high temperature reflow process for said overlying insulation layer and for driving said source regions and said shallow high concentration body dopant regions into designed junction depths; and (i) depositing a metal layer followed by applying a metal mask for pattening said metal layer to define a plurality of metal segments.

14. The method of fabricating said DMOS device of claim 10 wherein:

said step (a) of forming a thick-gate-oxide layer is a step of forming said thick-gate-oxide layer with a thickness of about 450 to 4000 Angstroms and said step (b) of forming said thin-gate-oxide layer is a step of forming said thin-gate-oxide layer with a thickness of about one-fourth to one-half of the thickness of said thick-gate-oxide layer ranging between 150 to 1000 Angstroms.

15. The method of fabricating said DMOS device of claim 11 wherein:

said step (c) of depositing a polysilicon layer and applying a gate mask for patterning a plurality of polysilicon segments covering over an entire length of said thick-gate-oxide segments and extended over said thick-oxide-thin-oxide interfaces to form a plurality of polysilicon-over-double-gate-oxide gates is a step of allowing a misalignment tolerance 0.15 to 0.30 micrometers between said gate mask and said thick-gate-oxide segments.

16. The method of fabricating said DMOS device of claim 12 wherein:

said step (e) of applying said source-implant-blocking oxide-segments for implanting a source dopant to form a plurality of source regions is a step implanting said source regions with a doping profile such that $Nc < (T_{ox2}/T_{ox1})^2 N_{MAX}$ where Nc is a source dopant concentration in said substrate immediately under said thick-oxide-thin-oxide interfaces, $T_{ox2}$ is a thickness of said thin-gate-oxide layer, $T_{ox1}$ is a thickness of said thick-gate-oxide segments, and said $N_{MAX}$ is a maximum dopant concentration of said source regions.

17. A method for fabricating a DMOS device supported on a substrate comprising steps of:

(a) forming a thick-gate-oxide layer on said substrate layer with a thickness of about 450 to 4000 Angstroms followed by applying thick-gate-oxide mask to define a plurality of thick-gate-oxide segments and a plurality of source-implant blocking oxide-segments between every two of said thick-gate-oxide segments;

(b) forming a thin-gate-oxide layer adjacent to said thick-gate-oxide having a thickness about one-fourth to one-half of a thickness of said thick-gate-oxide ranging between 150 to 1000 Angstroms thus defining a plurality of thick-oxide-thin-oxide interfaces;

(c) depositing a polysilicon layer and applying a gate mask for patterning a plurality of polysilicon segments covering over an entire length of said thick-gate-oxide segments and extended beyond said thick-oxide-thin-oxide interfaces covering a portion of said thin-gate-oxide layer thus forming a plurality of polysilicon-over-double-gate-oxide gates;

(d) implanting a body dopant between said plurality of thick-gate-oxide segments and said plurality of source-implant-blocking oxide-segments followed by a body diffusion for forming a plurality of merged wide-W-shaped body regions with each of said body regions diffused laterally in said substrate to a region under said thick-oxide-thin-oxide interfaces and said thick-gate-oxide segments wherein said substrate functioning as a drain region for said power device;

(e) implanting a source dopant between said plurality of thick-gate-oxide segments and said plurality of source-implant-blocking oxide-segments a plurality of source regions and said source regions having a doping profile with $Nc < (T_{ox2}/T_{ox1})^2 N_{MAX}$ where Nc is a source dopant concentration in said substrate immediately under said thick-oxide-thin-oxide interfaces, $T_{ox2}$ is a thickness of said thin-gate-oxide layer, $T_{ox1}$ is a thickness of said thick-gate-oxide segments, and said $N_{MAX}$ is a maximum dopant concentration of said source regions.

18. A method for fabricating a power device supported on a substrate comprising steps of:

(a) forming a thick-gate-oxide layer on said substrate followed by applying a thick-gate-oxide mask to define a plurality of thick-gate-oxide segments and source-implant-blocking oxide-segments;

(b) forming a thin-gate-oxide layer adjacent to said thick-gate-oxide segments having a thickness about one-fourth to one-half of a thickness of said thick-gate-oxide segments thus defining a plurality of thick-oxide-thin-oxide interfaces;

(c) depositing a polysilicon layer and applying a gate mask for patterning a plurality of polysilicon segments covering over an entire length of said thick-gate-oxide segments and extended beyond said thick-oxide-thin-oxide interfaces covering a portion of said thin-gate-oxide layer thus forming a plurality of polysilicon-over-double-gate-oxide gates; and (d) implanting a body dopant between said plurality of thick-gate-oxide segments and said plurality of source-implant-blocking oxide-segments followed by a body diffusion for forming a plurality of merged wide-W-shaped body regions with each of said body regions diffused laterally to said thick-oxide-thin-oxide interfaces and said thick-gate-oxide segments are above said substrate functioning as a drain region for said DMOS device.

19. The method of fabricating the DMOS device of claim 18 further comprising:

(e) employing said source-implant-blocking oxide-segments for implanting a source dopant to form a plurality of source regions and said source regions having a doping profile with $Nc < (T_{ox2}/T_{ox1})^2 N_{MAX}$ where Nc is a source dopant concentration in said substrate immediately under said thick-oxide-thin-oxide interfaces, $T_{ox2}$ is a thickness of said thin-gate-oxide layer, $T_{ox1}$ is a thickness of said thick-gate-oxide segments, and said $N_{MAX}$ is a maximum dopant concentration of said source regions.

* * * * *